United States Patent
Roa Fresno et al.

(10) Patent No.: US 8,758,481 B2
(45) Date of Patent: Jun. 24, 2014

(54) PHOTOVOLTAIC MODULE DEHUMIDIFIER

(75) Inventors: Javier Roa Fresno, Seville (ES); Alvaro Payan Rodriguez, Seville (ES)

(73) Assignee: Abengoa Solar New Technologies, S.A., Sevilla (ES)

( * ) Notice: Subject to any disclaimer, the term of this patent is extended or adjusted under 35 U.S.C. 154(b) by 275 days.

(21) Appl. No.: 13/319,247

(22) PCT Filed: May 4, 2010

(86) PCT No.: PCT/ES2010/000193
§ 371 (c)(1),
(2), (4) Date: Jan. 17, 2012

(87) PCT Pub. No.: WO2010/128181
PCT Pub. Date: Nov. 11, 2010

(65) Prior Publication Data
US 2012/0103187 A1    May 3, 2012

(30) Foreign Application Priority Data
May 7, 2009   (ES) .................................. 200901169

(51) Int. Cl.
*B01D 53/26*   (2006.01)
(52) U.S. Cl.
USPC ........ 95/23; 95/106; 95/126; 95/110; 95/146; 136/246
(58) Field of Classification Search
USPC ............ 95/1, 23, 106, 126; 96/109, 110, 115, 96/146; 34/80, 472, 473; 55/385.4; 136/243, 246
See application file for complete search history.

(56) References Cited

U.S. PATENT DOCUMENTS

| | | | | |
|---|---|---|---|---|
| 3,557,534 A | * | 1/1971 | Kennedy | 95/90 |
| 5,902,381 A | * | 5/1999 | Golner et al. | 96/146 |
| 6,226,888 B1 | * | 5/2001 | Lang | 34/332 |
| 6,709,493 B2 | * | 3/2004 | DeGuiseppi et al. | 96/7 |
| 2007/0251569 A1 | * | 11/2007 | Shan et al. | 136/246 |
| 2009/0173376 A1 | * | 7/2009 | Spencer et al. | 136/248 |
| 2011/0154683 A1 | * | 6/2011 | Vogt et al. | 34/418 |
| 2013/0036909 A1 | * | 2/2013 | Menard et al. | 95/91 |

FOREIGN PATENT DOCUMENTS

| | | |
|---|---|---|
| DE | 40 03 400 | 8/1991 |
| WO | WO 2007/087343 | 8/2007 |
| WO | WO 2009/014860 | 1/2009 |

* cited by examiner

*Primary Examiner* — Frank Lawrence, Jr.
(74) *Attorney, Agent, or Firm* — Hamre, Schumann, Mueller & Larson, P.C.

(57) ABSTRACT

Dehumidifier for photovoltaic modules, of a series of photovoltaic concentration modules, formed by a common air inlet and outlet access that communicates all the modules, and which passes through a bed of moisture absorbing material, having an electrical self-adjusted resistance (15) installed therein. The circuit is completed with a solenoid valve (13), a flow switch (19), a non-return valve (12); a pressure switch (16) and a timer relay (20). The process is based on pressure differences existing within the photovoltaic modules throughout the day, and consists of two steps: drying air by passing through the bed of absorbent material before entering into the photovoltaic modules and the regeneration of the drying system, which can be automatically or manually by connecting a compressor or fan.

7 Claims, 3 Drawing Sheets

PHOTOVOLTAIC MODULE DEHUMIDIFIER

TECHNICAL FIELD OF THE INVENTION

The present invention describes a system that allows maintaining the moisture level inside of a photovoltaic concentration module below allowable limits.

BACKGROUND OF THE INVENTION

The working principle of photovoltaic concentration technology (CPV) is to concentrate high levels of solar radiation on a receiver with reduced size. Using an optical system of much lower cost than that of the photosensitive material itself becomes one of the major photovoltaic technologies to reduce the total cost of the generated energy.

The majority of photovoltaic concentration modules (CPV) commercially available are based on an array of small point focus concentrators. These consist of closed-type structures provided on their front outer surface with a series of lenses. These lenses focus sunlight on the active elements or cells. Adjacent to the cells the electronic adaptation components: protection diodes and wiring are placed. The space located between these components and the lenses is filled with air.

The electronic elements above mentioned are very sensitive to moisture and the exposure thereto for a long time may cause accelerated degradation, which may limit their lifetime. Although these elements are usually covered with encapsulant materials, it is very important that the recipient maintains low humidity levels.

One could think of a solution based on the seal of the module, so as to prevent the entry of air coming from the outside; however this proposal could arise some problems, since the variations of environmental temperature and pressure could induce stresses that may eventually damage the module. It is therefore necessary to provide the system with an outlet that allows the air to pass to the outside when a pressure surge is caused, and the entry thereof in the reverse process, i.e., when the internal pressure decreases. Specifically, this second case would result in the entry of moist air therein.

The modules commercially available have not satisfactorily resolved this problem and the fact that moisture can penetrate therein, creates two main problems: the progressive degradation process, mainly by oxidation, due to the moisture both of the cell and other elements, and the condensation of vapor, because the relative humidity, pressure and temperature existing within the module can eventually cause the condensation of water on the surface of the lenses, thus hindering the light pass and dramatically reducing the system performance.

To resolve this problem many solutions are provided on the state of the art, although a few ones are applied to photovoltaic concentration modules. These solutions are mainly based on inside drying the module by injecting dry air.

The air drying method can vary from one system to another. There can be found solutions that go from making use of moisture-absorbing materials to some based on absorption by cold. In the latter, at a point in the air circuit located before the inlet of the container to be dried, a drop in the temperature is caused, which makes the water vapor contained in the air to condensate. This vapor is then removed in an operation similar to air conditioners.

However, these solutions do not prevent the entry of moist air from the outside, since it is still necessary to provide the module with an outlet for the injected air to avoid pressure surges that could damage the structure itself. As previously mentioned, the inclusion of said outlet or vent valve will allow the entry of moist air from the outside. Once the moist air has penetrated and has been condensed with the cold temperatures at night, its later disposal will be translated into a high energetic effort.

The invention presented here aims to anticipate the problem, i.e. to prevent the entry of moisture into the concentration module in order to avoid problems of oxidation and condensation, and the generated energy expenditure for their elimination. In the same way it is intended to be a daily self-regenerating system and with a minimum daily energy consumption.

DESCRIPTION OF THE INVENTION

As mentioned above, the main premise of the design of the dehumidifier for photovoltaic concentration modules lies in providing a solution directed to avoid the emergence of the problem and based on the maximum reduction of the energy consumption. For this reason, the dehumidifier system will use the characteristics of the very solar collection system in order to avoid the problem. In general, a photovoltaic concentration system consists of a series of individual modules electrically connected to each other. Each has in turn a set of equally interconnected cells. The modules contain air inside and are manufactured in a sealed manner, with its communication with the atmosphere being only through a vent valve for venting. This valve prevents the passage of liquid water but not of moist air.

Said modules are always in the outside, exposed to the action of the weather conditions, solar radiation, rain and wind. They are therefore subjected to an inner and outer thermal variation on daily basis.

These daily temperature variations also cause the variation of pressure inside the module and therefore, an amount of air goes in and out from each one, daily.

Interconnecting the modules together, by using a conduit with pneumatic connections to the body of each module, a single "breathing" access for all of them is achieved, with daily cadence. The invention is therefore designed to perform the moisture protection for several modules as a whole.

For drying the air before it enters into the solar concentration modules, the dewatering system will be formed by the common air inlet and outlet access that connects all modules, and which will pass through a bed made of moisture absorbent material, preferably silica gel, with an adjustable electrical resistance installed therein.

Knowing the number of connected modules is possible to calculate the amount of air going in and out depending on the temperature changes that are expected between day and night. Depending on the characteristics of the absorbent material used, the sizing of the system may be carried out in order to ensure that the point of saturation of the absorbent material is not reached at any time. In the case of silica gel, for example, is known that it has the capacity to absorb 35% of its weight in water.

According to this scheme, two phases of operation can be thus distinguished:

Phase 1: Air Entry

The air enters into the modules with very low humidity, after crossing the bed made of silica gel.

Phase 2: Air Exit

A flow rate or pressure sensor in the common conduit detects when the air starts to exiting from the modules. This moment will take place when there is a rise in temperature and therefore the pressure inside the module.

This sensor, when detects the air exiting, will connect the resistance inside the bed made of silica gel. By using the heat generated by the resistance and the dry air that comes out of the module (since it came in without moisture) will regenerate the bed made of gel expelling again the moisture outward. By being a self-adjusted resistance, the power consumption will minimum because automatically reduces its power by increasing the temperature.

In this way the system operates cyclically preventing the entry of moisture and self-regenerating with minimal power consumption, by being a fully autonomous system that exploits the very "breathing" of the module for regenerating the filter in its exiting process and for drying the air in its entering path, in fully automated manner and without requiring any manual action.

Still, there might be the case that the filter made of silica gel could collect residual moisture over time (months or years). To prevent this situation there is the possibility of manually regenerating thereof.

Therefore, the system includes an additional inlet which will normally be switched off or blocked. When you want to regenerate the bed of silica gel, compressor or fan having a timer will be connected to that inlet for a certain time (about 60 min). The air flow is detected by the system and automatically closes the entry to the modules, making it flow through the bed where the silica is. The same signal that closes the entry to the modules will be used to activate the self-adjusted resistance so as to allow the regeneration of the filter.

Finally, the invention also contemplates an embodiment in which a small compressor or fan, which is turn on a regular basis by using a timer, is permanently installed. Said timer would also activate the resistance inside the filter, in which case the flow detector could not be needed. In this new embodiment, the dry air entering process is independent (still being by natural entry) from that for regenerating the silica gel (it is now automatically programmed and controlled).

DESCRIPTION OF THE DRAWINGS

To complete the description being made and in order to help better understand the features of the invention, as an integral part of this description, a set of drawings is attached, in which in an illustrative and not limitative manner, the following has been represented.

PREFERRED EMBODIMENT OF THE INVENTION

To achieve a better understanding of the invention, the dehumidifier system, as well as its operation in its different phases will be described below.

Figure 1:
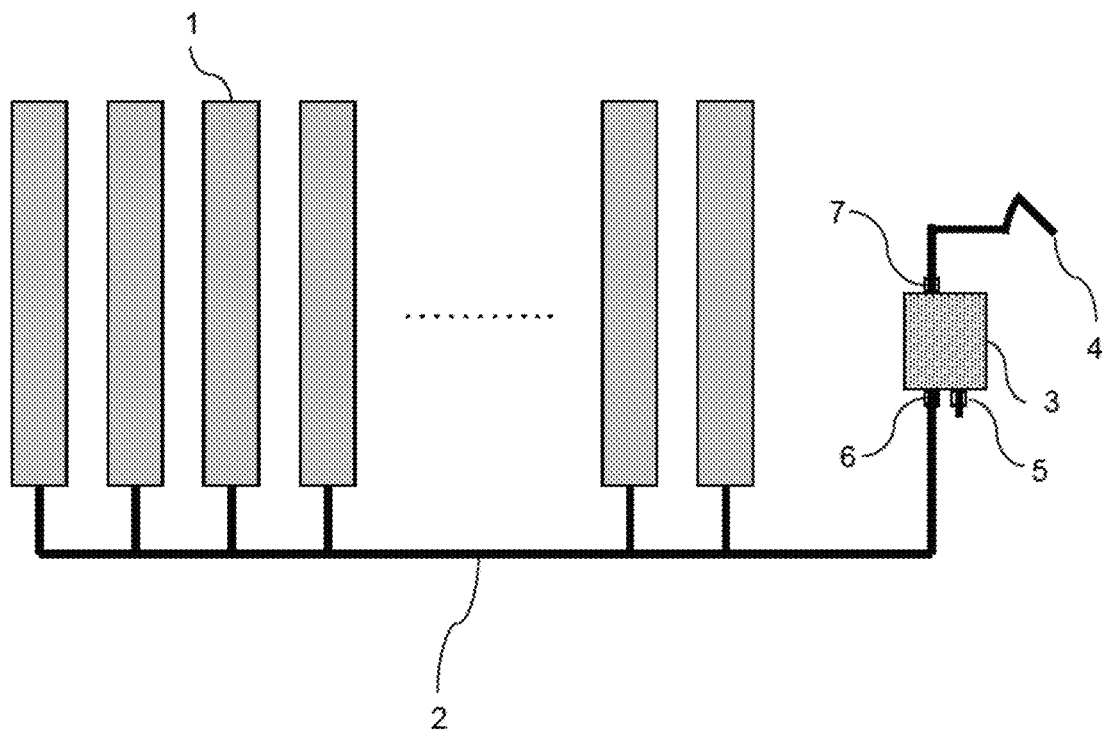
FIG. 1: Basic mounting of the invention in which a set of photovoltaic concentrators are interconnected by using pneumatic connections, so that they share a single breathing conduit. Along way of said conduit to the outside, the drying system is placed.

As shown in FIG. 1, so as the drying system to work correctly, all the photovoltaic modules (1) need to be properly connected to each other forming a single common pneumatic circuit (2) used to allow the entry and exit of air to/from the modules when the inner pressure varies by being subjected to temperature changes.

The common pneumatic circuit (2) is connected to the drying system (3) through the common inlet (6). The air flow that appears in the circuit due to changes in the pressure, communicates with the outside (4) through the outlet (7) of the drying system (3).

Additionally, the moisture filter (14) may be manually regenerated by connecting a small compressor or blower to the auxiliary inlet (5) of the drying system (3).

Figure 2:
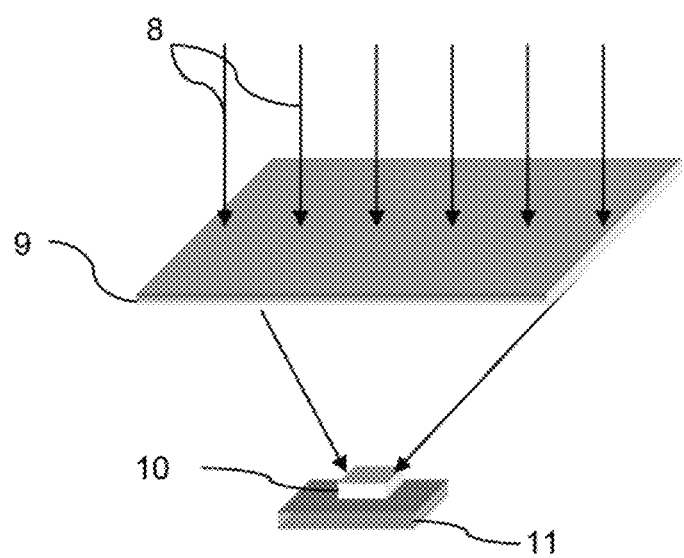
FIG. 2: Basic cell of a photovoltaic concentrator, consisting of a Fresnel lens that focuses sun lights on a photosensitive material or photovoltaic cell. Said cell is placed on a support or plate containing components for wiring and electrical protection.

FIG. 2 shows the basic elements making up an individual photovoltaic concentration cell. Sunlight (8) perpendicularly incident on the Fresnel lens (9) located in the front, is concentrated on a photosensitive material or photovoltaic cell (10). Such cell (10) is placed next to a series of electronic elements (11), which in the case of the figure appear just below, but could also be placed on the side.

The basic photovoltaic concentration cell shown in FIG. 2 is usually grouped into arrays of different geometries forming a single dosed structure so-called photovoltaic concentration module (1). A photovoltaic module (1), regardless of its geometry, will form a closed, hollow, thus existing air in the space between the lenses (9) and the cells (10) along with other electronic components (11) that accompany it.

Outside temperature variations will cause changes in the pressure of such air. Thus, in the present invention the system is provided with a common pneumatic connection circuit (2) through which said air is channeled and passing of which is forced, both in the exiting and entering processes, by the drying system (3) object of the invention.

Figure 3:
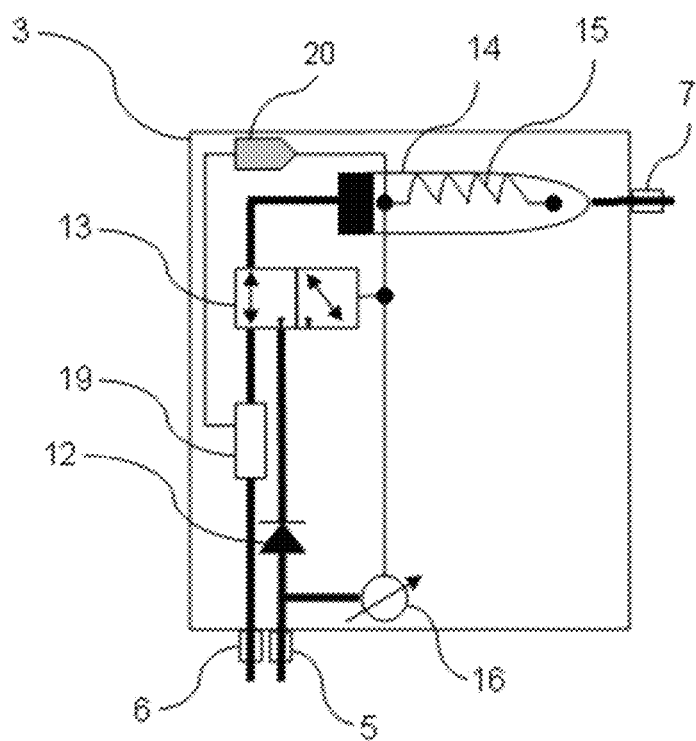
FIG. 3: Basic diagram of the drying system.

In its basic configuration, the basic operating diagram for the drying system (3) is that shown in FIG. 3. The key element is a filter (14) into which the silica gel (or other moisture absorbing material) is placed. A self-adjusted resistance (15) is also placed therein, which if activated, the filter temperature (14) increases up to the levels wherein the air flow would allow regenerating the silica gel dragging the accumulated moisture in it.

Additionally, the embodiment shown in FIG. 3 has a solenoid valve 2/1 (13), a flow switch (19) that activates an electrical signal when measures in a certain sense a flow rate greater than a value that has been programmed, a timer relay (20), a non-return valve (12) and a pressure switch (16), which triggers an electrical signal in case of measuring a certain pressure value above a predetermined threshold.

In the air exiting process, which will appear due to an increase of the temperature and hence the pressure inside the modules (1), all the resulting air flow will enter the drying system (3) through the common inlet (6). In its resting state, the solenoid valve (13) will allow its flow to the outside (4) through the outlet (7) and after passing through the filter (14) in which is the absorbent material. Along its way through the drying system (3) the air will pass through a first flow switch (19) that will allow measuring the flow rate. Such flow switch (19), when detecting an output flow rate above a previously preprogrammed predetermined threshold, activates the self-adjusted resistance (15) located inside the filter (14). In the exiting process and due to the temperature reached within seconds inside the filter (14), the air is able to draw the moisture that had been accumulated on the silica gel to the outside (4) through the outlet (7) of the drying system (3).

In order to avoid the on and off of the resistance by transient changes in pressure, to the electrical output signal of the flow switch (19) a desired time delay may be applied by using a timer relay (20). Thus, the self-adjusted resistance (15) will only be on when the output flow rate remains above the value programmed into the flow switch (19) for a certain period higher than that provided by the timer relay (20).

In the opposite process, the air entry from the outside (4) due to a drop in the temperature and internal pressure, the air flow will travel along the reverse route entering through the outlet (7) of the drying system (3). When passing through the filter (14), the air coming from outside (4) is dried by passing its water vapor content to the very absorbent material (silica gel). In this case, the self-adjusted resistance (15) will remain off because the flow switch (19) allows distinguishing the flow direction. Once the air is dried, it will enter into each module through the common pneumatic connection circuit (2).

To avoid the possible case that after several cycles of operation, the silica gel becomes saturated, there is included the possibility of manually regenerating the filter (14). To do this, there will only be necessary to connect a small compressor or fan to the auxiliary inlet (5) of the drying system (3). The resulting pressure increase will be detected by the pressure switch (16), which will act on the valve (13) giving way to the inflow towards the filter (14) previously passing through a protection non-return valve (12). The pressure switch (16) will also act on the self-adjusted resistance (15) allowing the regeneration of the filter (14). The protection non-return valve (12) will cause a small drop in the pressure between its entry and exit, so that despite switching the solenoid switch (13) and giving free passage to the air, it remains a minimum level of pressure that allows maintaining active the signal of the pressure switch (16).

Having described in detail the system, its operation can be transferred to the real diary cyclic case: throughout the day there is a time of maximum temperature from which begins a drop in the temperature inside the concentration modules (1). This drop in the temperature causes a decrease in the internal pressure, and therefore the entry of the outside air into the modules. This air entering process will continue until the temperature stabilizes at its minimum value. During this process, the atmospheric air passes through the filter (14) and enters into the modules (1) with a humidity degree below 10%.

In another time of the day, the inner temperature rise, the rise in the pressure and volume, and the exiting of inside air begin. The air exiting is detected by the flow rate sensor or flow switch (19) that connects the electrical self-adjusted resistance (15) inside the filter (14) and which automatically sets it at 100° C. By using the heat generated and the dry air exiting from the modules, the bed made of silica gel is regenerated by expelling the moisture.

In this way, the time of maximum temperature from which the air entering process begins again will be reached again.

Figure 4:
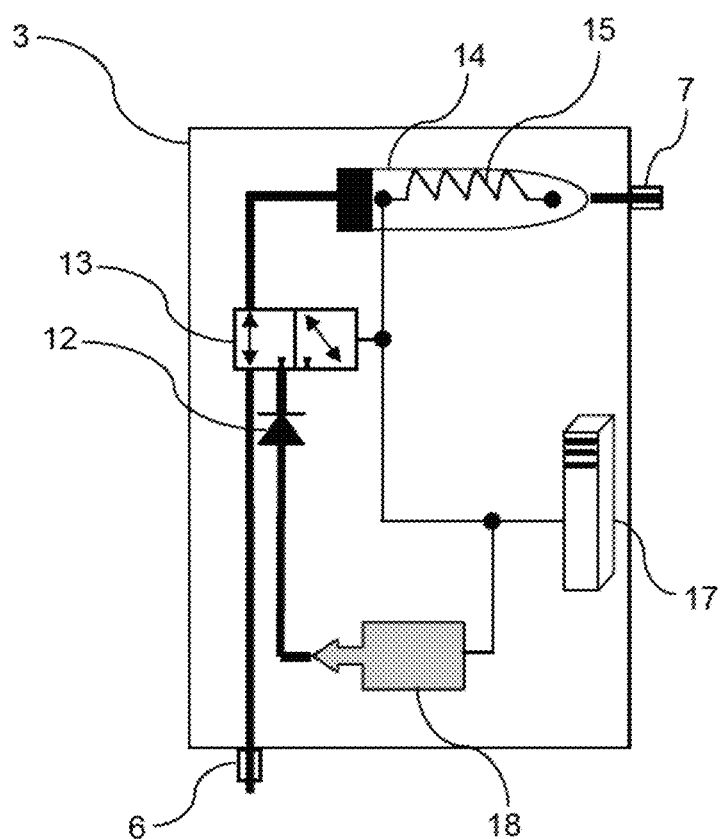
FIG. 4: Alternative embodiment of the invention in which the regeneration of the filter is accomplished by forced air injection periodically.

In an alternative embodiment as proposed in FIG. 4, is permanently included in the drying system (3) a small compressor or fan (18) and a timer (17) that allow not using the flow switch (19), the pressure switch (16) and auxiliary inlet (5). The main difference of this embodiment with respect to that shown in FIG. 3, lies in the air exiting process and in the process for regenerating the filter (14). Unlike the previous embodiment, there is no flow detector (19) that activates the self-adjusted resistance (15) of the filter (14). Consequently, in its exiting process, the air expelled by the modules (1) to the outside will not lead to the regeneration of the filter (14). Instead, a timer (17) scheduled to be activated periodically, will activate the compressor or fan (18), the solenoid valve (13) and the self-adjusted resistance (15) resulting in an automatic and periodic regeneration of the filter (14). The period of regeneration does not necessarily have to be daily. It should be calculated based on the period of time that the silica gel takes to reach saturation levels which would require its regeneration.

In this embodiment, although the filter regeneration process is different from the previous one, the reverse process (air entering) will not present any difference. In those times wherein the inner pressure decreases as a result of a drop in the temperature, the inlet air flow will pass through the filter (14) being free of moisture and ensuring at all times the flow of dry air inside the photovoltaic modules (1).

The system that has been described, in various embodiments, although having its main application in photovoltaic concentration modules, it could also be applied in other industrial fields requiring an air drying in a similar manner as that presented.

The invention claimed is:

1. A dehumidifier for photovoltaic modules, which maintains a humidity level inside a series of photovoltaic concentration modules below allowable limits, wherein the dehumidifier comprises a common pneumatic circuit that connects all the photovoltaic modules to each other, and which is connected to a drying system through a common inlet; the drying system having a circuit comprising a filter, inside of which is a moisture absorbing material and a self-adjusted resistance, as well as a solenoid valve, a flow switch, a non-return valve, a pressure switch and a timer relay; wherein the dehumidifier also has an auxiliary inlet.

2. The dehumidifier for photovoltaic modules according to claim 1, wherein the dehumidifier comprises a small compressor connected to the auxiliary inlet in order to manually regenerate the filter.

3. A procedure for dehumidifying a set of photovoltaic modules connected together by a common pneumatic circuit, wherein the procedure comprises a regeneration step of a drying system and a drying step for the air to be introduced into the photovoltaic modules wherein:

the regeneration step of the drying system takes place during an air exiting process of the modules, which appears due to an increase in temperature and pressure inside the modules, wherein a resulting flow of air entirely enters into a drying system through a common inlet; wherein a solenoid valve in a resting state allows for a flow to the outside through an outlet after having passed through the inside of a filter containing a moisture absorbing material; wherein a flow switch detects an output flow rate above a previously programmed predetermined threshold and triggers a self-adjusted resistance that is placed inside the filter; and wherein during the exiting process and due to a temperature reached within seconds inside the filter, the air is able to extract moisture accumulated in the moisture absorbent material to the outside through the outlet of the drying system; and during the drying step of air entering from the outside due to a drop in the temperature and internal pressure of the modules, air flow follows a reverse route by entering through the outlet of the drying system so that when passing through the filter, the air coming from outside is dried passing water vapor content to the moisture absorbing material, such that the self-adjusted resistance remains off, because the flow switch allows distinguishing the flow directional; once the air has been dried, the air will enter into each module through the common pneumatic connection circuit.

4. The procedure for dehumidifying, according to claim 3, wherein the procedure includes a manual regenerating of the filter by connecting a small compressor to an auxiliary inlet of the drying system wherein a resulting pressure increase is detected by a pressure switch, which will act on the solenoid valve giving way to an inflow towards an inside of the circuit through a protection non-return valve such that an injected air flow is guided towards outside through the outlet and having previously passed through the filter, a signal coming from the pressure switch, which acts on the solenoid valve, activates the self-adjusted resistance thus allowing regeneration of the filter; a protection non-return valve causing a small drop in pressure between entry and exit, so that despite switching the solenoid valve and giving free passage to air, a minimum level of pressure allows maintaining active the signal of the pressure switch.

5. The procedure for dehumidifying according to claim 3, wherein during the regeneration step and in order to avoid an on and off of the resistance by transient changes in pressure, a desired time delay is applied to an electrical output signal of the flow switch by using a timer relay; so that, the self-adjusted resistance is only on when an output flow rate remains above a value programmed into the flow switch for a certain period higher than that provided by the timer relay.

6. A dehumidifier for photovoltaic modules, which maintains a humidity level inside a series of photovoltaic concentration modules below allowable limits, wherein the dehumidifier comprises a common pneumatic circuit that connects all the photovoltaic modules to each other, and which is connected to a drying system through a common inlet; wherein the drying system has a circuit comprising a filter, inside of which is a moisture absorbing material and a self-adjusted resistance, as well as a solenoid valve, a non-return valve and a timer relay; and wherein the drying system includes a small compressor and a timer.

7. A procedure for dehumidifying a set of photovoltaic modules connected together by a common pneumatic circuit, wherein the procedure comprises a regeneration step of a drying system and a drying step for the air to be introduced into the photovoltaic modules wherein:

the regeneration step is carried out in a programmed and periodical manner by using a timer that is responsible for activating a compressor, a solenoid valve and a self-adjusted resistance, resulting in an automatic and periodic regeneration of a filter; a regeneration period being calculated depending on the time that it takes for a moisture absorbing material to reach saturation levels; and the drying step of air entering from outside due to a drop in the temperature and internal pressure of the modules wherein air flow travels a reverse route by entering through the outlet of the drying system so that when passing through the filter, the air coming from outside is dried passing water vapor content to the moisture absorbing material, the self-adjusted resistance remaining because the flow switch allows distinguishing the flow direction; and wherein, once the air has been dried, the air enters into each module through a common pneumatic connection circuit.

* * * * *